United States Patent [19]
Wada

[11] Patent Number: 5,334,858
[45] Date of Patent: Aug. 2, 1994

[54] SEMICONDUCTOR DEVICE OF TAB STRUCTURE, CAPABLE OF ENSURING EASE OF TESTING OF SAME IN FINAL FORM

[75] Inventor: Shinobu Wada, Yokohama, Japan

[73] Assignee: Kabushiki Kaisha Toshiba, Kawasaki, Japan

[21] Appl. No.: 85,149

[22] Filed: Jul. 2, 1993

Related U.S. Application Data

[63] Continuation of Ser. No. 822,878, Jan. 21, 1992, abandoned.

[30] Foreign Application Priority Data

Jan. 22, 1991 [JP] Japan ............................. 3-006024

[51] Int. Cl.⁵ ............................................. H01L 23/02
[52] U.S. Cl. ....................................... 257/48; 257/666; 257/691; 257/694; 257/737
[58] Field of Search ................... 357/74, 70; 257/48, 257/666, 692, 694, 691, 737

[56] References Cited

U.S. PATENT DOCUMENTS

| | | | |
|---|---|---|---|
| 4,701,781 | 10/1987 | Sankhagowit | 357/74 |
| 4,837,184 | 6/1989 | Lin et al. | 357/74 |
| 5,083,191 | 1/1992 | Ueda | 357/74 |

*Primary Examiner*—William Mintel
*Assistant Examiner*—Roy Potter
*Attorney, Agent, or Firm*—Banner, Birch, McKie & Beckett

[57] ABSTRACT

A semiconductor device comprises a tape member, an IC chip mounted on the tape member, a plurality of leads arranged on the tape member each having one end connected to the IC chip and the other end provided with an area to be used for testing the IC chip and an insulation member for covering said plurality of leads except the one ends and the areas to be used for testing the IC chip, the tape member being provided with one or more one openings that reach the plurality of leads. With such an arrangement, the plurality of leads can be easily accessed and brought into contact with probes for testing the IC chip.

6 Claims, 7 Drawing Sheets

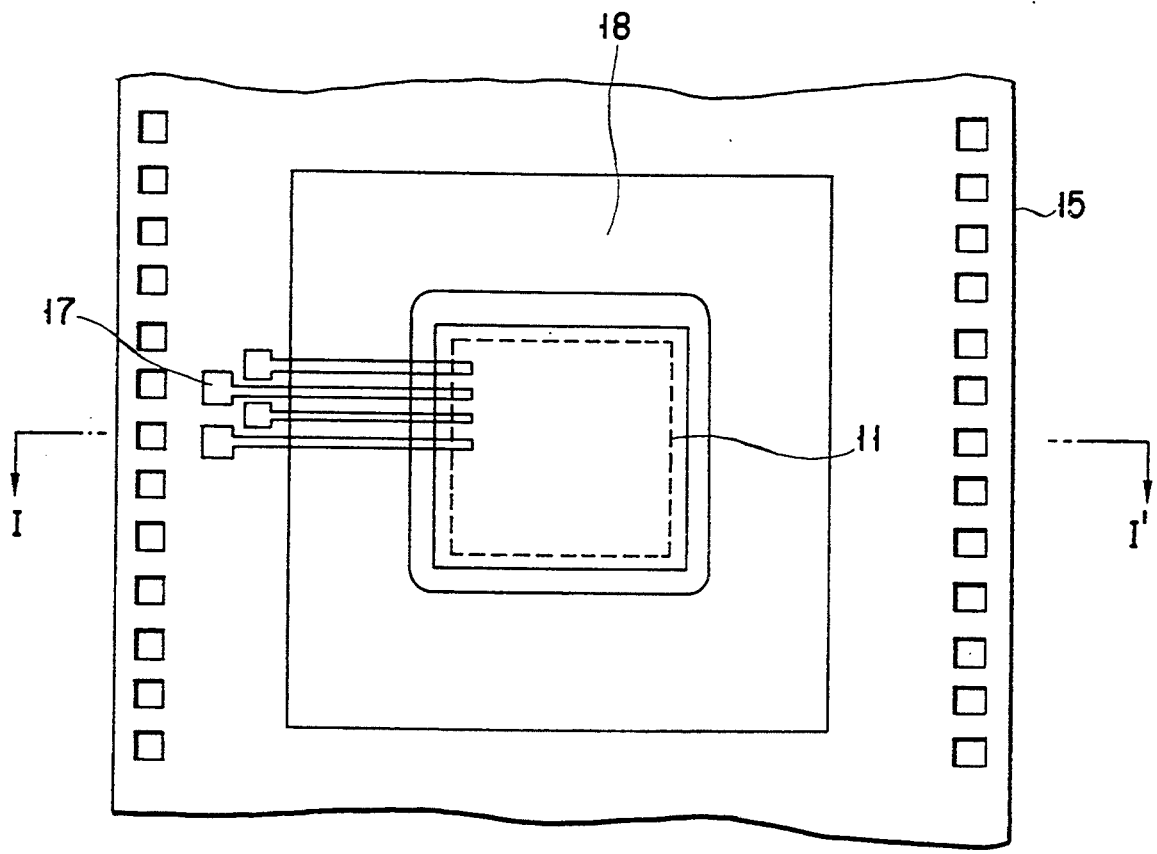
F I G. 2B

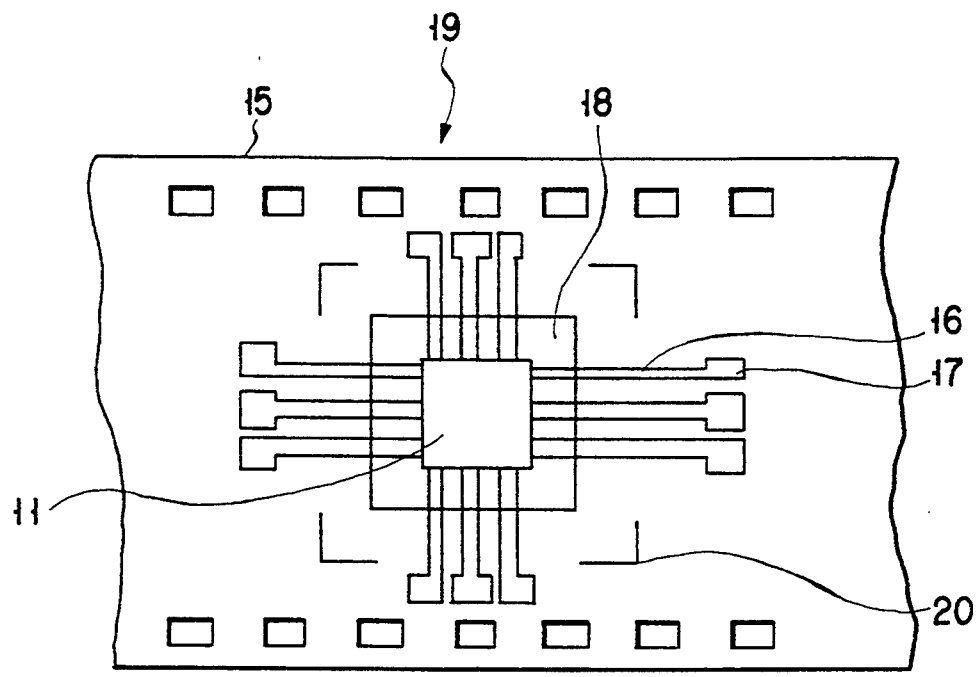
F I G. 3A
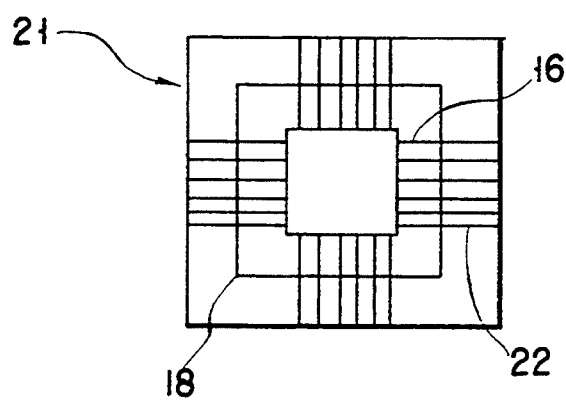
F I G. 3B

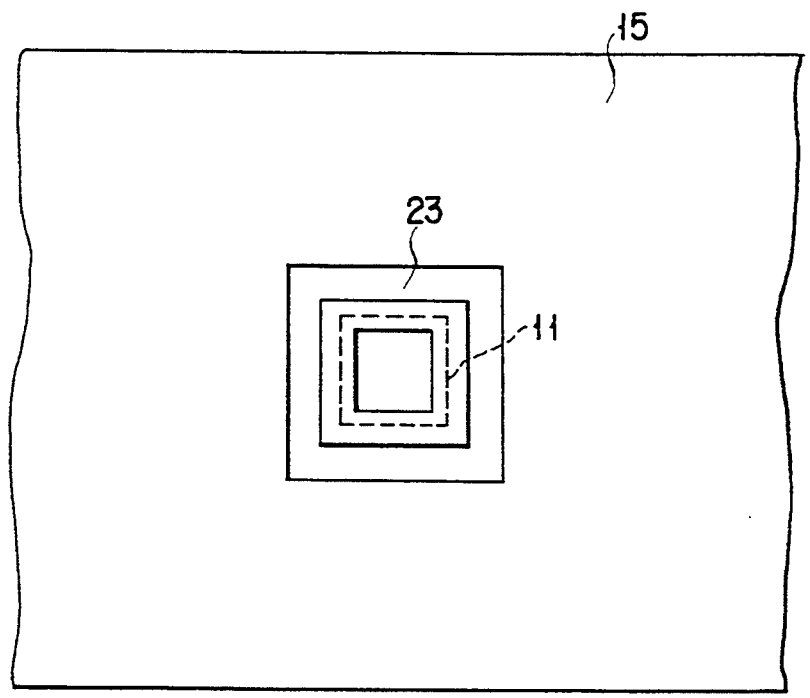
F I G. 5
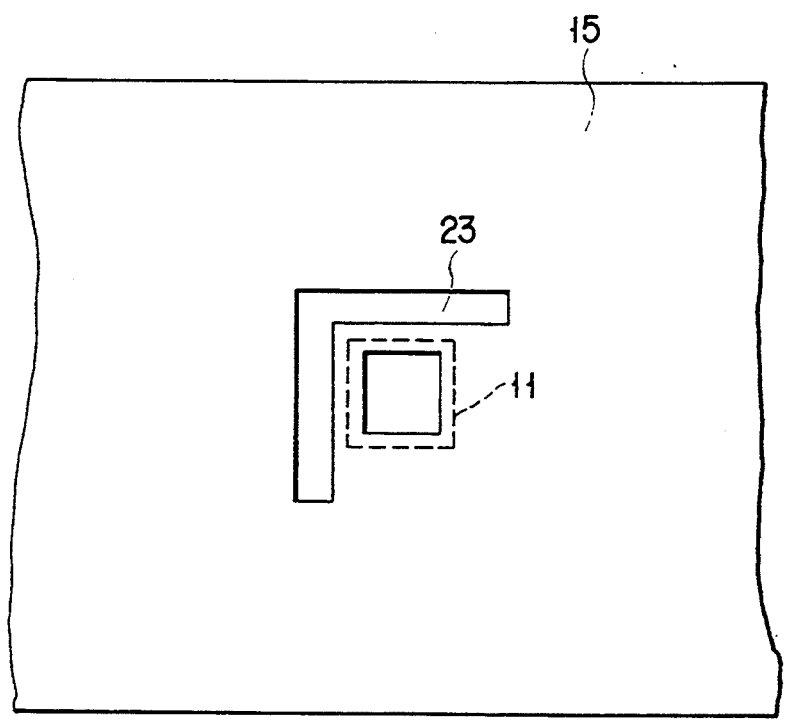
F I G. 6

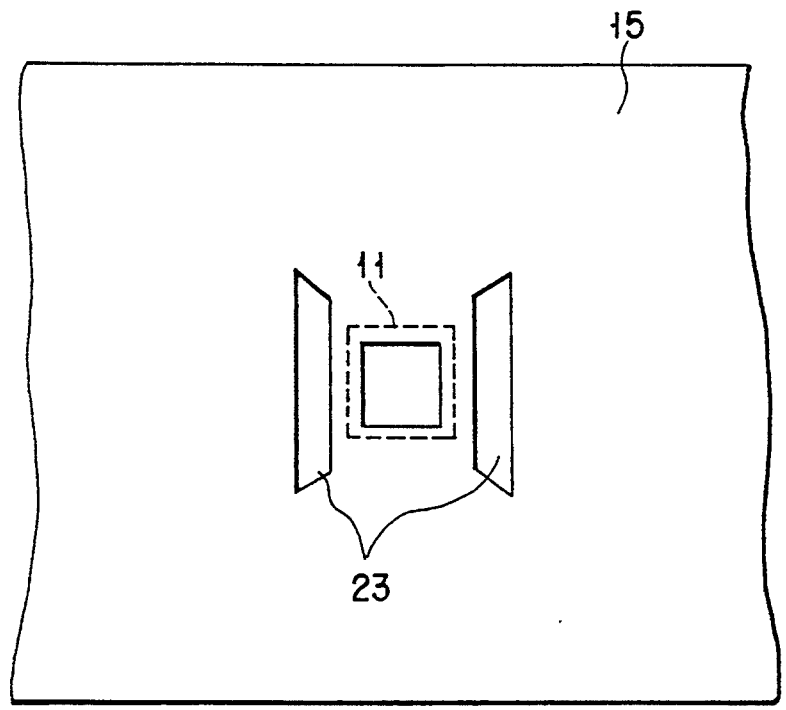
F I G. 7
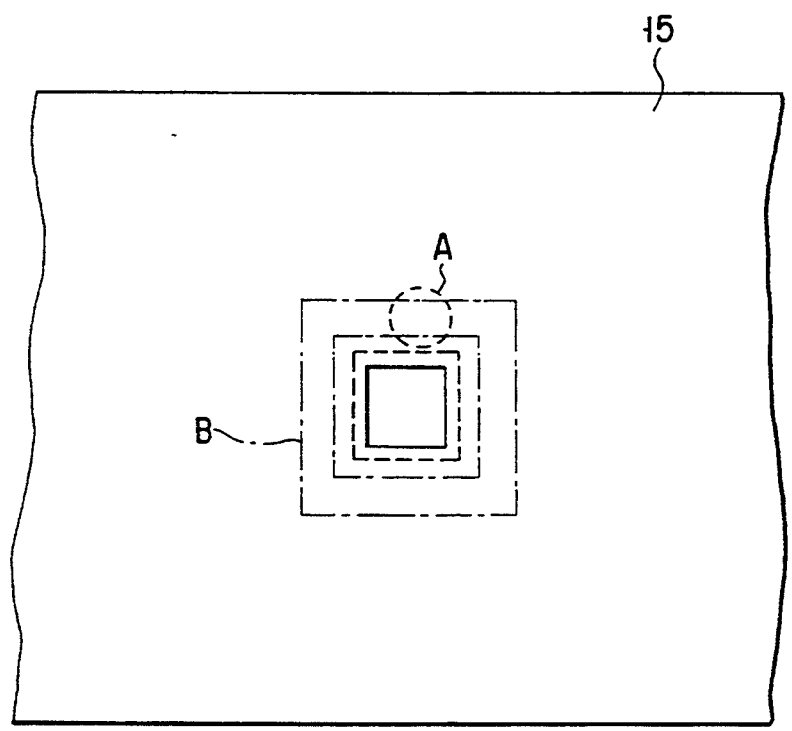
F I G. 8A

SEMICONDUCTOR DEVICE OF TAB STRUCTURE, CAPABLE OF ENSURING EASE OF TESTING OF SAME IN FINAL FORM

This application is a continuation of application Ser. No. 07/822,878, filed Jan. 21, 1992, now abandoned.

BACKGROUND OF THE INVENTION

1. Field of the Invention

This invention relates to an improvement to a film carrier tape to be used for tape automated bonding (TAB).

2. Description of the Related Art

A semiconductor device which is finished by tape automated bonding (hereinafter referred to TAB) is normally subjected to two probing tests, which are conducted before and after mounting an IC chip on a film carrier tape.

The first probing test is carried out electrically by bringing the bumps 12 of an IC chip 11 into contact with respective probes 14 of a stationary card 13 of a testing instrument as illustrated in FIG. 1 of the accompanying drawings, while the second probing test is also an electric test where testing areas 17 of the conductive leads 16 of a film carrier tape 15 are brought into contact with respective probes 14 of a stationary card 13 of a testing instrument.

When a semiconductor device passed the above described tests, the film carrier tape 15 carrying the device is cut along a number of cutting marks 20 shown in FIG. 3A to separate the device from the tape and produce an independent product 21 as shown in FIG. 3B. Then, the exposed front end portions 22 of leads extending from an insulation layer 18 are bonded to the substrate to bring forth a completely finished semiconductor device.

There may be cases, however, where a finished semiconductor device 21 that has passed two probing tests as described above needs to be tested for another time. Now, the leads 16 of the device are mostly covered by the insulation layer 18 which is made of a resist to protect the device and only slightly exposed out of the insulation layer 18 at the front ends. Obviously, it is a very difficult job to make the tiny front end portions of the leads contact with probes of a stationary card of a testing instrument.

Moreover, if a semiconductor device whose leads have been bonded to the substrate needs to be tested, they must be separated from the substrate in the first instance at the risk of damaging them to bring the device out of order once and for all.

Besides, when a final product 21 is tested by bringing the front end portions of the leads into contact with respective probes of a testing instrument and it is found to be faulty, there is no way to determine if the fault is in the IC chip or somewhere in the leads.

In an attempt to overcome this drawback, there has been proposed a method of separating the IC chip main body from the film carrier tape that carries the chip by means of some chemical agent so that it may be subjected to a test with ease. But, again, such a method is not without danger of damaging the IC chip and exfoliating the bumps on the chip. Therefore, such a chemical method is practically not feasible.

Under these circumstances, a semiconductor device can only be visually checked if it is found faulty after installing the IC chip on the substrate and, therefore, there is no way to pinpoint the trouble of the device to find out if the fault is in the IC chip or somewhere in the leads.

SUMMARY OF THE INVENTION

In view of the above described circumstances, it is, therefore, the object of the present invention to provide a semiconductor device prepared by TAB that can be tested to pinpoint any defects after having been installed on a substrate.

According to the present invention, the above object of the invention is achieved by providing a semiconductor device having a tape member, an IC chip mounted on the tape member, a plurality of leads arranged on the tape member each having a first end connected to the IC chip and a second end provided with an area to be used for testing the IC chip and an insulation member for covering the plurality of leads except the first ends and the areas to be used for testing the IC chip, the tape member being provided with one or more than one openings that reach the plurality of leads.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2B is a plan view of the film carrier tape of FIG. 2A.

FIGS. 3A and 3B are plan views of a conventional semiconductor device carried by a film carrier tape in two different stages after a series of probing tests.

FIGS. 5, 6, 7B, 8A, 8B and 9 are plan views of possible alternative openings that can be applicable to a film carrier tape to be used for a semiconductor device according to the invention.

DETAILED DESCRIPTION OF THE PREFERRED EMBODIMENT

Figure 1:
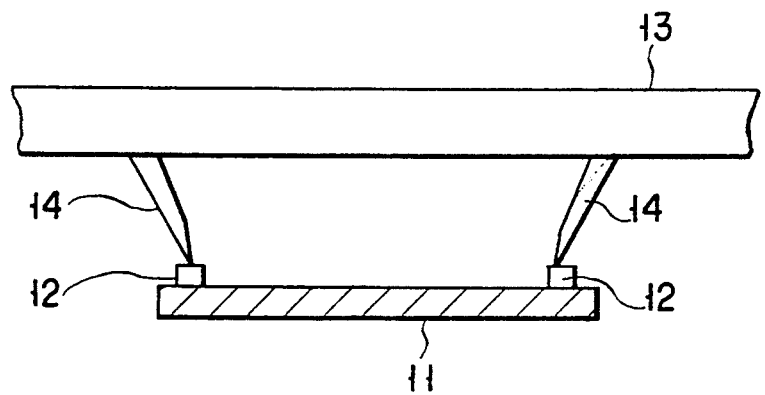
FIG. 1 is a sectional view of a conventional semiconductor device connected with probes for a probing test.
Figure 2A:
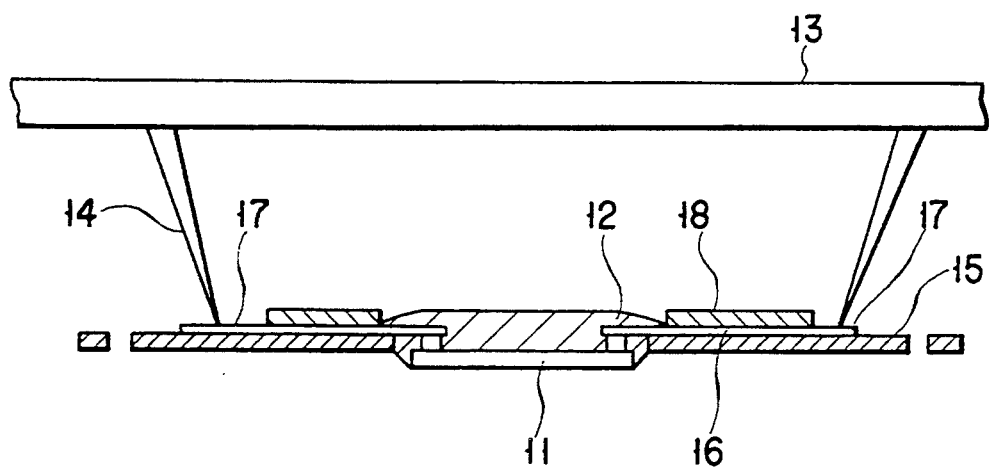
FIG. 2A is a sectional view of a conventional semiconductor device connected with probes for a probing test and carried by a film carrier tape.
Figure 4:
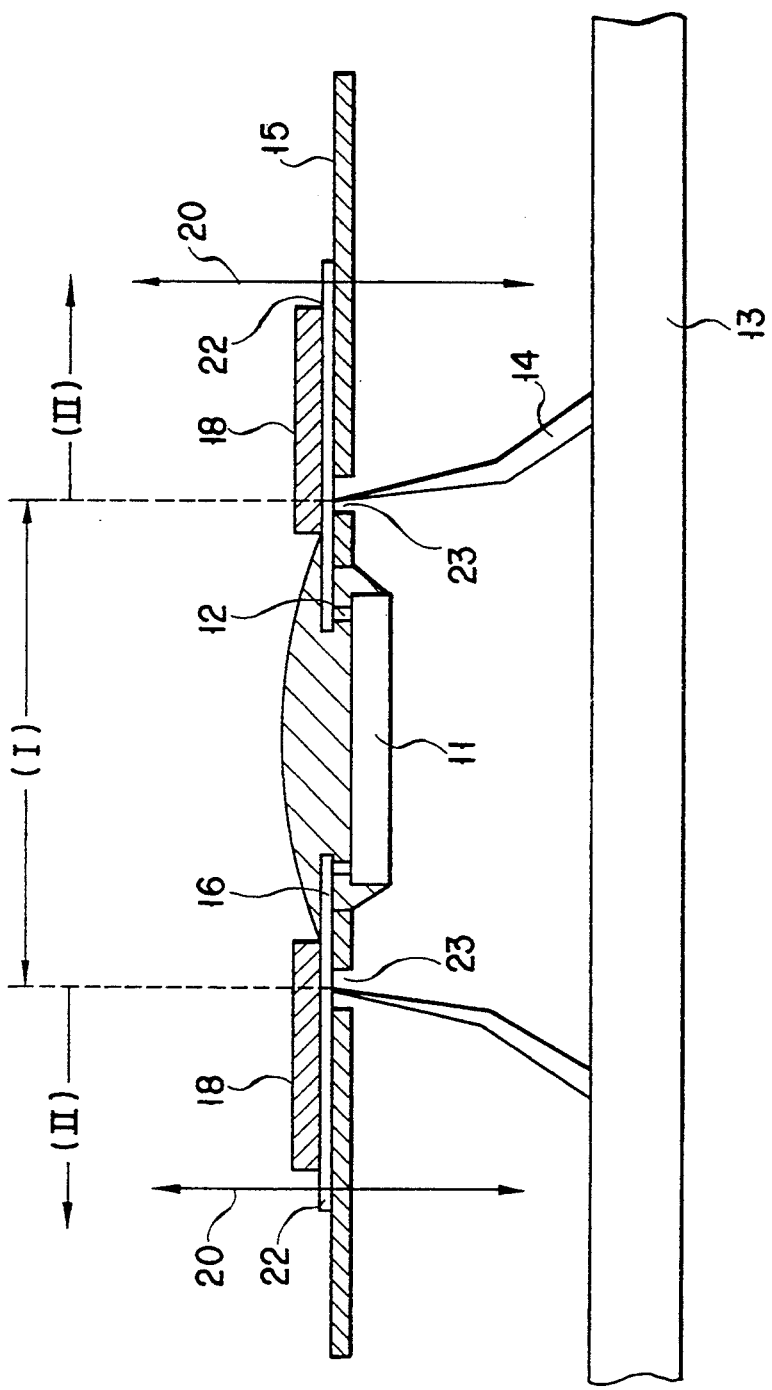
FIG. 4 is a sectional view of an embodiment of the present on a film carrier tape.

FIG. 4 that shows a film carrier tape carrying an embodiment of the semiconductor device of the present invention. A film carrier tape of the present invention may be characterized in that it is provided with one or more than one openings in the form of slits or holes in an area for mounting an IC chip.

As seen in FIG. 4, a film carrier tape (or a continuous tape member for the purpose of this embodiment) 15 has a chip area for mounting an IC chip 11 and one or more than one openings arranged in a given manner around the chip area. The openings arranged in a given manner may be realized in the form of slits or holes. A plurality of leads 16 are laid on the film carrier tape 15 each having an end (first end) located in the chip area and another end (second end) provided with an area 22 to be used for testing the IC chip carried by the tape. The first end of each of the plurality of leads 16 is connected to one of a plurality of bumps 12 and an insulation member 18 is arranged on said plurality of leads 16 to cover the leads 16 except the areas arranged near the ends for testing the IC chip.

A semiconductor device prepared by assembling the above described components is, after a series of probing tests, separated from the excessive film carrier tape 15 by cutting the latter along a number of cutting marks 20 arranged on it. Consequently, the second ends of the plurality of leads 16 become slightly exposed out of the insulation member 18 so that they may be conveniently mounted on a substrate.

Now, since the film carrier tape 15 is provided in advance with one or more than one openings 23 arranged in a given fashion to partly expose the plurality of leads 16, these leads 16 can be easily accessed from the back-side of the film carrier tape 15 (or the side opposite to the principal side where the insulation member 18 is arranged) to bring them into contact with respective probes 14 of a stationary card 13 of a testing instrument.

If the openings 23 are arranged very close to the IC chip 11, a defect, if any, of the semiconductor device may be pinpointed so that it may be easy to tell if it is on the chip side (I) or the lead side (II) of the openings.

FIGS. 5 through 9 illustrate possible alternative arrangements of openings 23 cut through a film carrier tape to be used for a semiconductor device according to the invention. Note that, in each of these drawings, the film carrier tape is viewed from the backside or the side opposite to the one where a plurality of leads 16 are arranged.

FIG. 5 shows an arrangement using a single opening realized in the form of a quadrilateral slit completely surrounding an IC chip 11. If the opening 23 is formed exactly on those leads (not shown) that must be connected to terminals of a testing instrument for testing certain functional aspects of the product, the remaining leads may be left intact while the exposed leads can be easily connected to respective probes of the instrument.

FIG. 6 also shows a single opening 23 arrangement but the opening 23 here is realized in the form of an L-shaped slit that partly surrounds an IC chip 11. Here again, if the opening 23 are formed exactly on those leads (now shown) that must be connected to terminals of a testing instrument for testing certain functional aspects of the product, the remaining leads may be left intact while the exposed leads can be easily connected to respective probes of the instrument.

Figure 8B:
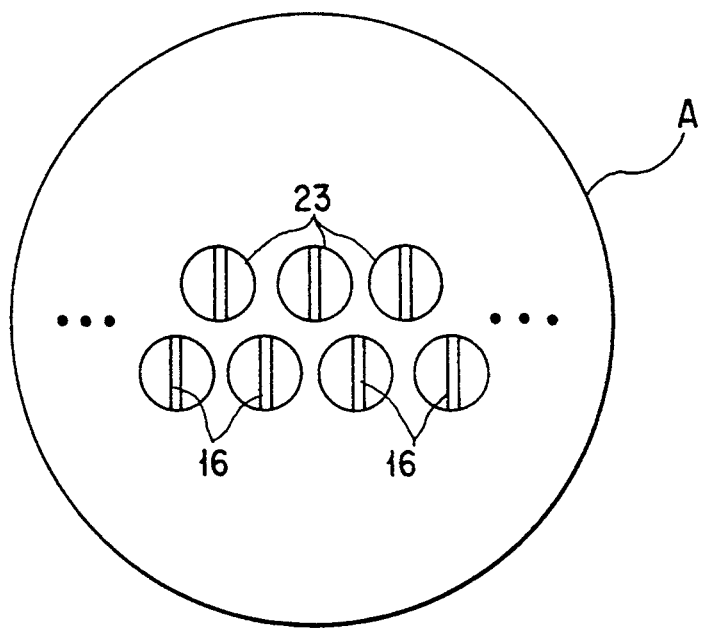
Figure 9:
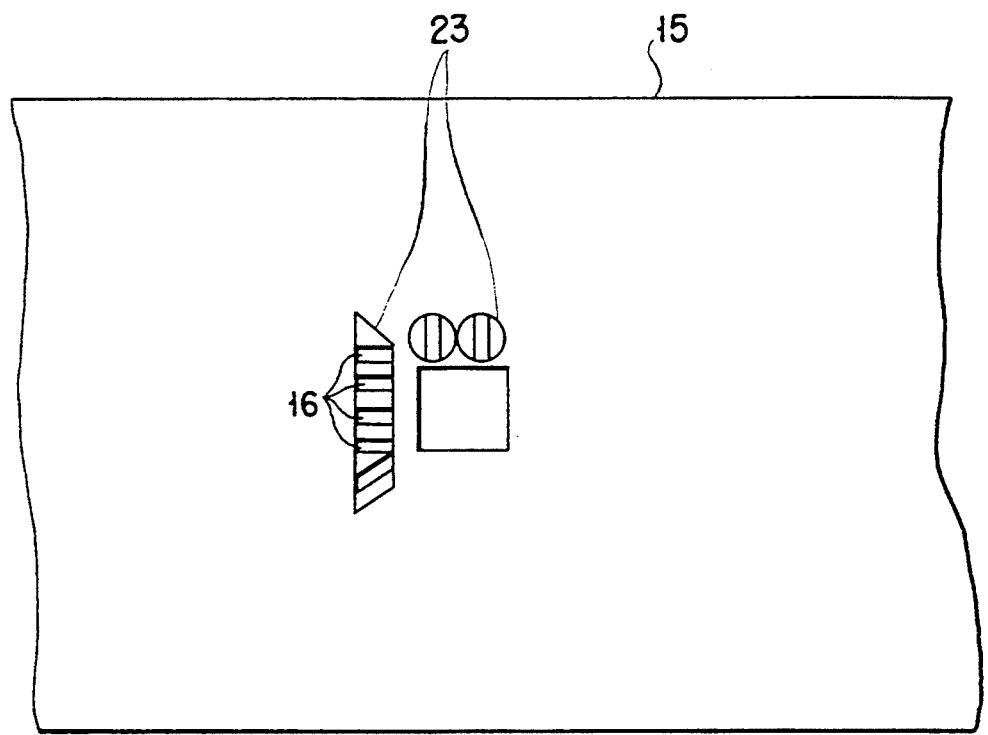

FIG. 7 shows an arrangement where a pair of straight slits 23 are formed along a pair of opposite sides of an IC chip 11. FIGS. 8A and 8B shows an alternative arrangement where a number of circular openings 23 are formed in a zigzag manner. Such an arrangement will be advantageous when leads 16 are densely laid. B in FIG. 8A indicates an area where circular openings 23 are arranged. FIG. 9 illustrates a combination of slits and circular openings.

As is apparent from the above description, since a film carrier tape to be used for a semiconductor device according to the invention is provided with one or more than one openings realized in so many slits and/or circular openings and arranged in a given manner so that they reach a plurality of leads, the semiconductor device can be tested without difficulty after the product is finished or when the front end portions of the leads are separated from the substrate or otherwise damaged. With such an arrangement, a defect, if any, of a semiconductor device according to the invention can be pinpointed so that it may be easy to tell if it is on the chip side or the lead side of the openings.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device comprising:
   a tape member having first and second faces, at a center of which a hole is formed;
   a plurality of leads having first and second ends and mounted on the first face of said tape member so that the first ends project over said hole;
   a slit formed in a portion of said tape member around the hole, said slit being located below portions of said leads which are proximate to the first ends, said slit exposing said leads to permit contact with a probe;
   a semiconductor chip arranged in aid hole and in contact with the first ends;
   a first insulation member located in said hole, for covering at least a contact portion where said semiconductor chip and the first ends are in contact with one another; and
   a second insulation member formed on said leads and said slit, for covering said leads except for the second ends thereof.

2. The semiconductor device according to claim 1, wherein said slit completely surrounds said hole.

3. The semiconductor device according to claim 1, wherein said slit partly surrounds said hole.

4. A semiconductor device comprising:
   a tape member having first and second faces, at a center of which a first hole is formed;
   a plurality of leads having first and second ends and mounted on the first face of said tape member so that the first ends project over the first hole;
   a plurality of second holes arranged in a plurality of lines in a staggered manner, the second holes being formed in a portion of said tape member around the first hole, said second holes being located below portions of said leads which are proximate to the first ends, said second holes exposing said leads to permit contact with a probe;
   a semiconductor chip arranged in the first hole and in contact with the first ends;
   a first insulation member located in the first hole, for covering at least a contact portion where said semiconductor chip and the first ends are in contact with one another; and
   a second insulation member formed on said leads and said second holes, for covering said leads except for the second ends thereof.

5. The semiconductor device according to claim 4, wherein said plurality of second holes completely surrounds the first hole.

6. The semiconductor device according to claim 4, wherein said plurality of second holes partly surrounds the first hole.

* * * * *